(12) United States Patent
Jarrar et al.

(10) Patent No.: US 8,339,177 B2
(45) Date of Patent: Dec. 25, 2012

(54) MULTIPLE FUNCTION POWER DOMAIN LEVEL SHIFTER

(75) Inventors: Anis M. Jarrar, Austin, TX (US); Anuj Singhania, Austin, TX (US); Bryan T. Weston, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 42 days.

(21) Appl. No.: 13/014,454

(22) Filed: Jan. 26, 2011

(65) Prior Publication Data

US 2012/0187998 A1 Jul. 26, 2012

(51) Int. Cl.
*H03L 5/00* (2006.01)
(52) U.S. Cl. .............................. 327/333; 326/62; 326/80
(58) Field of Classification Search .............. 326/62–63, 326/80–81; 327/306, 333
See application file for complete search history.

(56) References Cited

U.S. PATENT DOCUMENTS

| | | | |
|---|---|---|---|
| 5,929,688 A * | 7/1999 | Ueno et al. ..................... | 327/333 |
| 6,960,953 B2 * | 11/2005 | Ichihara ........................ | 327/333 |
| 7,005,889 B2 | 2/2006 | Sowden et al. | |
| 7,112,996 B2 * | 9/2006 | Lee ................................. | 326/68 |
| 7,675,345 B2 * | 3/2010 | Fayed ............................ | 327/333 |
| 7,863,963 B2 * | 1/2011 | Zhang et al. ................... | 327/333 |
| 2010/0085079 A1 | 4/2010 | Campbell et al. | |
| 2010/0102851 A1 | 4/2010 | Muha et al. | |
| 2010/0148818 A1 | 6/2010 | Deutscher et al. | |

* cited by examiner

*Primary Examiner* — Dinh T. Le
(74) *Attorney, Agent, or Firm* — Gary Stanford

(57) ABSTRACT

A level shifter including input and output power nodes, input and output reference nodes, input and output signal nodes, and a lever shifter network. The input power and input reference nodes operate within a first power domain and the output power and output reference nodes operate within a second power domain. The level shifter network receives an input signal operable within the first power domain, performs voltage shifting between the input and output power nodes and between the input and output reference nodes, and provides an output signal output signal indicative of the input signal that operates within the second power domain. The level shifter may include power and/or ground bypass such that either one or both of power and ground voltage shifting may be bypassed for faster switching. The level shifter may include an isolation input to assert the output to a known level.

19 Claims, 10 Drawing Sheets

US 8,339,177 B2

MULTIPLE FUNCTION POWER DOMAIN LEVEL SHIFTER

BACKGROUND OF THE INVENTION

1. Field of the Invention

The present invention relates generally to level shifters for interfacing independent power domains, and more particularly, to multiple function and configurable level shifters for shifting signals to compatible voltage levels between domain crossings in systems with multiple power domains.

2. Description of the Related Art

In order to optimize the trade-off between speed and power consumption, many electronic circuits include multiple independent power domains. Power domains are differentiated by a variance between a voltage level of a power source, such as a difference in voltage level between a ground or reference voltage level, generally referred to as "VSS", or a difference in voltage level between a source voltage level, generally referred to as "VDD." Power domains may alternatively be referred to as voltage domains which operate within different voltage levels. A level shifter may be provided at an interface or "crossing" between separate or otherwise independent power domains so that a signal asserted by one power domain operating at one voltage level is level shifted and driven to a different voltage level compatible with another power domain. As used herein, each signal is generally considered a digital or a binary signal which is switched between opposite logic levels, such as logic one (1) and logic zero (0). Also, the signals described herein and shown in the Figures, including voltage supply signals, input signals, output signals, etc., are developed on corresponding nodes with the same name unless otherwise specified. Each logic level is determined relative to a specific voltage level, so that it is desired that the signals are switched within voltage levels that are compatible with the power domain receiving the signal. Otherwise, an incompatible binary signal may be misinterpreted which could lead to an incorrect result which may lead to improper operation or even operation malfunction.

The operative voltage level of a given power domain may be modified when the power domain is placed into a different operating mode, such as any one of several power-conserving modes (e.g., standby, sleep, hibernation, etc.). A level shifter with bypass may be used to bypass voltage level shifting when the voltage level between two domains are equal or otherwise become equal. A level shifter may be implemented with isolation, such as an isolation cell or the like, to drive an output of a powered-down domain to a known logic level provided to an input of a domain which remains powered-up.

For some technology nodes, significant reductions in leakage and power consumption can be obtained by back biasing transistor devices, provided that the circuitry is operated at a lower frequency. Back biasing generally involves driving a voltage differential between the bulk or substrate of a device and the gate of the device. In a standard complementary metal-oxide semiconductor (CMOS) configuration, the source and substrate of P-channel MOS (PMOS) devices are both tied to VDD and the source and substrate of N-channel MOS (NMOS) devices are both tied to VSS. In one conventional back biased CMOS configuration, the bodies of PMOS devices are pulled to a voltage above VDD and the substrates of NMOS devices are pulled to a voltage below VSS. Since VSS is typically defined at zero (0) Volts (V) or ground, a charge pump or the like is used to drive the substrate of NMOS devices to a negative voltage level below ground. One disadvantage with the conventional back bias approach is the use of a relatively low efficiency charge pump or the like which increases overall power consumption. Another disadvantage is the corresponding increase of the overall voltage swing. Such back bias approach is particularly disadvantageous for battery-powered electronic devices with limited overall voltage range.

An alternative back biasing technique is referred to herein as "source biasing," in which the substrate of NMOS devices are held or otherwise tied to ground and the voltage level of VSS is increased, which increases the voltage level of the source terminals of NMOS devices. There is generally sufficient headroom even in battery-powered devices to drive the substrates of P-type devices above VDD so that the overall voltage range is not appreciably affected. The source biasing technique may result, however, in power domains operating at different ground potentials in some power modes. If the power domains were also operated with different VDD source voltages, a power level-shifter and a ground level-shifter were both needed to level shift the signal for both power and ground levels. The use of multiple level-shifting cells, however, was error-prone and caused additional delays.

The industry would benefit from the availability of level shifters that cross both source voltage and ground domains, that minimize delays by bypassing level shifting when appropriate, and that provides built-isolation if desired.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
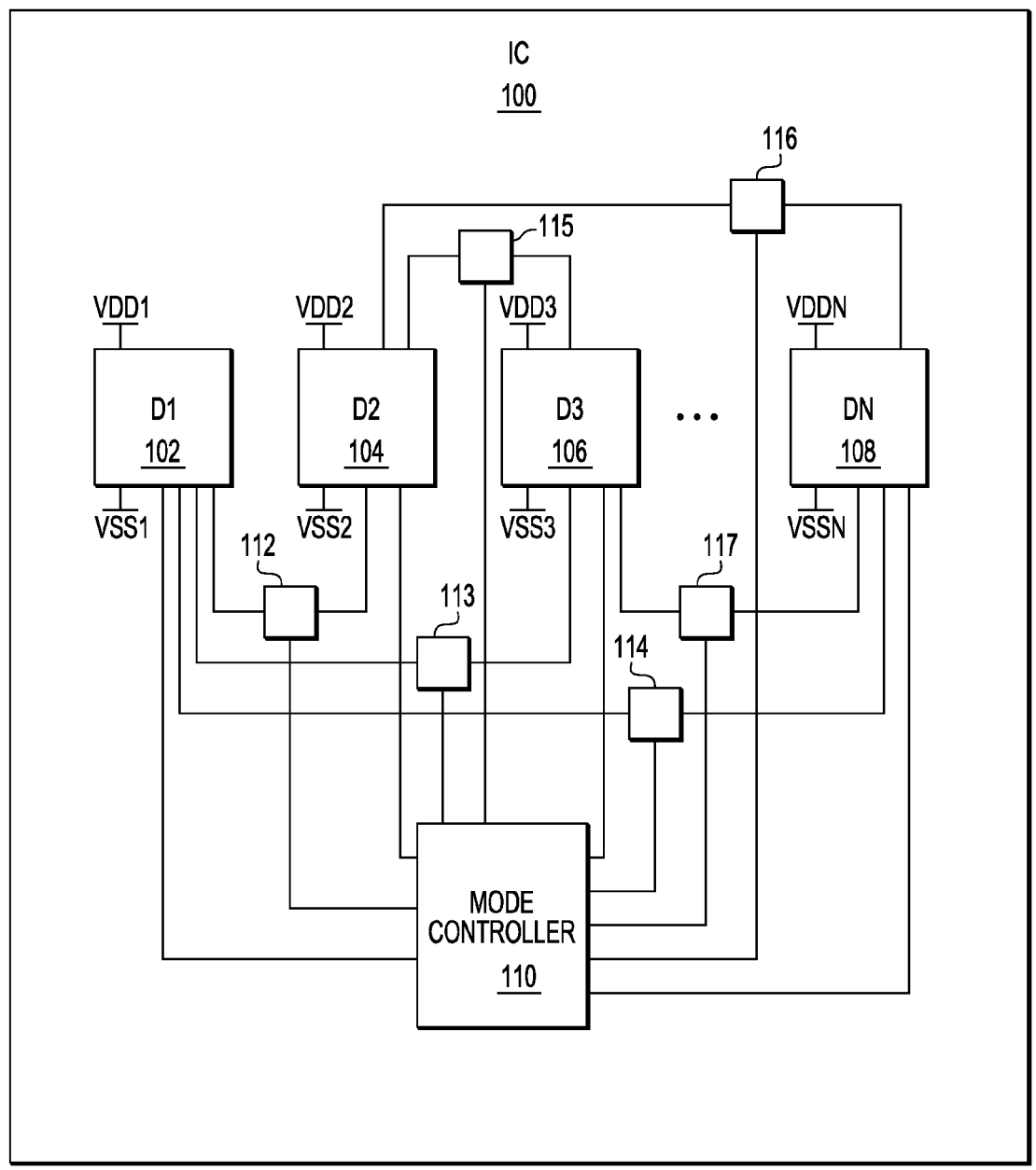
FIG. 1 is a diagram of one embodiment of an integrated circuit with multiple power domains and corresponding level shifters between the domain crossings.

FIG. 1 is a diagram of one embodiment of an integrated circuit (IC) 100 with a number "N" of different power domains D1, D2, D3, . . . , DN (D1-DN) 102-108 in which N is a positive integer greater than one. Each power domain D1-DN receives power via a separate source voltage VDD and a separate reference voltage VSS, shown as VDD1 and VSS1 for D1, VDD2 and VSS2 for D2, and so on up to VDDN and VSSN for DN. The source voltage and/or reference voltage of any two or more power domains may be the same or different depending upon the particular implementation (e.g., VDD1 and VDD2 may have the same or different voltage levels, etc.). Also, although four domains D1, D2, D3 and DN are shown, it is understood that any number of domains may be included (e.g., 2 or more). Any one or more of the domains may have fixed source voltage levels, and any one or more of the power domains may be switchable between different operating modes and thus with modified source voltages and/or reference voltages. Examples of power modes include a full power "run" mode and one or more reduced power modes (e.g., standby, sleep, hibernation, etc.). One or more of the reduced power modes may be equivalent to an "off" mode in which one or more power domains are powered-down. One or more of the reduced power modes may be a power savings mode which is a lower performance run mode, such as operative at a lower frequency level. For example, a power savings run mode is contemplated in which one or more power domains include source biasing and are operated at a reduced frequency.

Multiple interfaces 112-117 are provided and distributed to include a separate interface between each of the power domains D1-DN. It is noted that although an interface is shown between each pair of domains, it is understood that any two or more domains may not be interfaced with each other (e.g., no interface is provided between certain domains). Each interface 112-117 includes one or more binary signals asserted in either direction. Each interface 112-117 also includes any selectable number (zero or more) of level shifters in which each level shifter shifts the voltage of a signal between power domains. Many different types of level shifters are contemplated. A power-only level shifter is provided when the source voltages (VDD) are different between two domains while the reference voltages (VSS) are at about the same voltage level. A ground-only level shifter may provided when the reference voltages (VSS) are different between two domains while the source voltages (VDD) are at about the same voltage level.

It is noted that ground level shifting is provided when the domain sourcing the signal has a higher reference voltage level than the reference voltage level of the destination to ensure that the appropriate logic level is communicated. On the other hand, ground level shifting may or may not be provided when the domain sourcing the signal has a lower reference voltage level than the reference voltage level of the destination, since the device within the source domain simply overdrives the device receiving the signal in the destination domain. A ground-level overdrive condition is acceptable when the proper logic information is conveyed between domains. At least one of the level shifters within the interfaces 112-117 of the IC 100 shifts both power and ground. Some of the level shifters include built-in isolation circuitry, providing either a logic 0, logic 1, or logic-hold output when a domain sourcing a signal is powered down. A logic-hold output means that the output is held at the same state it was at when the domain is powered-down. Isolation protects powered-up domains from spurious signals or otherwise unknown signal levels potentially output by powered-down domains. Some of the level shifters also include built-in bypass circuitry to reduce delays when level shifting is not used. Bypass may be used, for example, when the operating mode of one domain is changed or modified so that it operates with substantially the same voltage level as another domain.

The IC 100 further includes a mode controller 110 which is shown coupled to each of the domains D1-DN and to each of the interfaces 112-117. The mode controller 110 controls the state or mode of one any of the power domains D1-DN having multiple modes of operation. The mode controller 110 also controls any of the level shifters within any of the interfaces 112-117 to adjust operation depending on the power domain modes. For example, the mode controller 110 selectively enables bypass of power level or ground level shifting and/or selectively enables isolation when appropriate.

The IC 100 is configured according to any of a variety of implementations. In one embodiment, the IC 100 is configured as a system-on-chip (SOC), such as including processor, input/output (I/O) and memory functions. One example of a SOC configuration is a microcontroller unit (MCU). In one embodiment, a library of level shifters are available during IC implementation in which a designer may select any type and any number of level shifters from the library for placement at any of the interfaces 112-117 to ensure proper operation between the power domains D1-DN. It should be understood that circuitry and networks described herein may be implemented either in silicon or any other type of semiconductor material.

Figure 2:
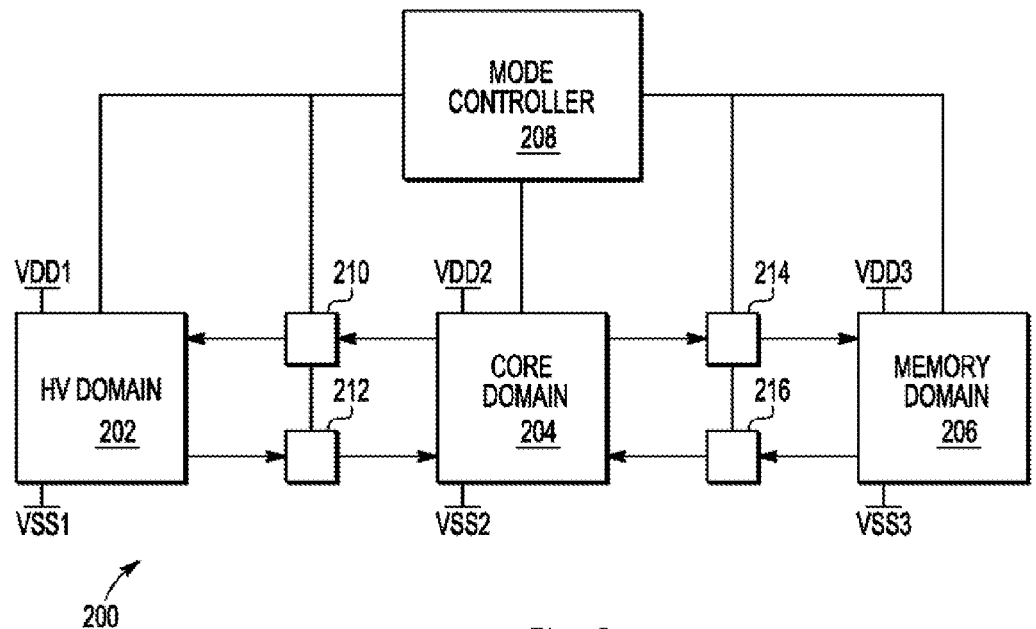
FIG. 2 is a block diagram of a more specific embodiment of a system including separate high-voltage (HV), core and memory domains and level shifters between domain crossings controlled by a mode controller.

FIG. 2 is a block diagram of one embodiment of a system 200 which may be implemented on an integrated circuit, such as the IC 100, representing a more specific embodiment. The system 200 includes a high-voltage (HV) domain 202, a core domain 204, and a memory domain 206. The domains 202, 204 and 206 are considered "independent" in that they are powered by different VDD source voltages, or by different VSS reference voltages, or by differences of both, meaning different VDD and VSS voltages. The system 200 operates in at least three separate operating modes, including a full power mode, a reduced power mode, and a standby (or sleep) mode. A mode controller 208 is provided and coupled to the HV domain 202, the core domain 204 and the memory domain 206 for controlling the mode of operation of the core and memory domains. Although the mode controller 208 is shown coupled to control the HV domain 202, in the illustrated embodiment the HV domain 202 remains "always on" so that it operates substantially the same in each of the operation modes. The system 200 further includes level shifters 210 and 212 at domain crossings between the HV domain 202 and the core domain 204, and level shifters 214 and 216 at domain crossings between the core domain 204 and the memory domain 206. The mode controller 208 is coupled to the level shifters 210, 212, 214, and 216 (214-216) for adjusting level shifting operation or configuration between the operating modes.

In one embodiment, the HV domain 202 is a higher voltage, "always-on" domain for operating devices that remain powered regardless of the power mode of the system 200 (when power is available). The HV domain 202 receives source voltage VDD1 relative to a reference voltage VSS1. In one embodiment, VDD1 and VSS1 remain unmodified during any of the operating modes of the system 200. Examples of devices within the HV domain 202 include analog sensors, such as touch sensors or the like for sensing external stimuli to wake up the rest of the system 200, low-power timers, low power display devices (e.g., segment liquid-crystal display or LCD), devices designed to perform housekeeping functions, analog interface devices, etc. The HV devices in the HV domain 202 may be relatively slow devices which perform housekeeping functions or other limited functions during any of the power modes of the system 200. In one embodiment, for example, the devices in the HV domain 202 are dual-gate oxide (DGO) devices which remain powered on. DGO devices are higher voltage, low-leakage devices which are particularly advantageous for battery-powered devices.

In the illustrated embodiment, the core domain 204 is switchable between an unbiased full power mode (e.g., high performance run mode), a source biased low frequency power savings mode, and a source biased powered-down or "off" mode. In one embodiment, the powered-down mode of the core domain 204 is used during the standby mode of the system 200. The core domain 204 receives source voltage VDD2 relative to a reference voltage VSS2. Source biasing the core domain 204 significantly reduces leakage current, by as much as an order of magnitude, and reduces dynamic power consumption by reducing the voltage swing. The performance tradeoff is that the core domain 204 runs at a reduced frequency during the power savings mode. The level of source biasing may be increased during the powered-down mode relative to the power savings mode to minimize leakage current during the standby mode. In one embodiment, VDD2 remains at a lower voltage relative to VDD1 during the full power and power saving modes, and is turned off during the standby mode. In one embodiment, VSS2 is asserted to about the same voltage as VSS1 during the full power mode, and is increased above VSS1 during the power saving and standby modes to implement source biasing.

In one embodiment, the memory domain 206 remains powered on during each of the operating modes of the system 200. In another embodiment, the memory domain 206 may be placed in a sleep mode or the like in which it receives sufficient operating voltage to retain stored information. In another embodiment, the memory domain 206 may remain fully on or may be turned fully off during the standby mode of the system 200. The memory domain 206 receives source voltage VDD3 relative to a reference voltage VSS3. In one embodiment, the operating voltage level of VDD3 is about the same voltage level as VDD2 during the full power and power savings modes. In one "always on" embodiment, VDD3 remains unmodified during the standby mode. In another embodiment, VDD3 may be turned off during the standby mode of the system 200. The reference voltage VSS3 may remain at the same voltage level of VSS1 during each of the operating modes of the system 200. Alternatively, VSS3 may be implemented with source biasing to retain information and conserve power during the standby mode.

In one embodiment, VDD1 and VSS1 for the HV domain 202 are asserted to about 3V and 0V, respectively, in all three modes (full power, power savings, and standby). VDD2 and VSS2 for the core domain 204 are asserted to 1.2V and 0V, respectively, in the full power mode, 1.2V and about 0.4V, respectively, in the power savings mode, and 0V and 0.4V, respectively, the in powered down standby mode. In one embodiment, although VDD2 is 0V, there may be state-retention devices (e.g., flip-flops) within the core domain 204 which may receive the normal 1.2V supply voltage and thus which remain powered on during the standby mode. Thus, VSS2 is pulled to 0.4V for source biasing any of those devices within the core domain 204 which remains powered on. VDD3 and VSS3 for the memory domain 206 are kept at a constant 1.2V and 0V, respectively, in all three modes and remains unbiased.

The level shifter 210 performs voltage shifting of a signal asserted by the core domain 204 and provided to the HV domain 202. The level shifter 210 performs both power and ground level shifting and includes power and ground bypass and isolation. During the full power mode, VDD1>VDD2 and VSS1 is about the same as VSS2 so that the level shifter 210 performs only power level shifting. The mode controller 208 controls the level shifter 210 so that ground level shifting is bypassed during the full power mode. During the power savings mode, VSS2>VSS1 (e.g., VSS2 is raised to about 0.4V for source biasing) so that the level shifter 210 performs both power and ground level shifting. In this mode, the mode controller 208 controls the level shifter 210 so that ground level shifting is not bypassed (e.g., ground level bypass is off). During the standby mode, the mode controller 208 controls the level shifter 210 to perform isolation since VDD2 is turned off while VSS2 remains above VSS1 for source biasing. Although the core domain 204 is effectively turned off during the standby mode, the level shifter 210 asserts its output to a known logic level (e.g., logic 1, logic 0, or logic hold) so that the level shifter 210 performs both power and ground level shift with isolation.

The level shifter 212 performs voltage level shifting of a signal asserted by the HV domain 202 and provided to the core domain 204. Although the level shifter 212 may be configured in substantially the same manner as the level shifter 210, the level shifter 212 may be simplified. The level shifter 212 at least performs power level shifting. During the full power mode, VDD1>VDD2 and VSS1 is about the same as VSS2 so that the level shifter 212 performs only power level shifting. The level shifter 212 may include ground level shifting with ground level shift bypass. During the power savings mode, VSS2>VSS1 (e.g., VSS2 is raised to about 0.4V for source biasing) so that the level shifter 212 performs power level shifting and may perform ground level shifting. When the domain asserting the signal has its VSS at a lower voltage than the VSS of the destination domain, as is the case between the HV domain 202 and the core domain 204, then ground level shifting may be omitted since the device within the HV domain 202 driving the signal may overdrive the device in the core domain 204 receiving the signal. If ground level shifting is included for the level shifter 212, then the mode controller 208 controls the level shifter 212 to bypass ground level shifting during the full power mode. In one embodiment, the level shifter 212 includes isolation, so that during the standby mode, the mode controller 208 controls the level shifter 212 to perform isolation since VDD2 is turned off while VSS2 remains above VSS1 for source biasing. In this case the level shifter 212 asserts its output to a known logic level compatible with the core domain 204. In an alternative embodiment, the level shifter 212 does not include isolation since the level of the signal asserted by the HV domain 202 is inconsequential when the core domain 204 is powered down.

The level shifter 214 performs voltage level shifting of a signal asserted by the core domain 204 and provided to the memory domain 206. Although the level shifter 214 may be configured in substantially the same manner as the level shifter 210, the level shifter 214 may be simplified. The level shifter 214 at least performs ground level shifting with bypass. During the full power mode, VDD2 and VDD3 are about the same and VSS2 and VSS3 are about the same, so that ground level shifting capability is bypassed. During the power savings mode, VSS2>VSS3 (e.g., VSS2 is raised to about 0.4V for source biasing) so that the level shifter 214 performs ground level shifting. In one embodiment, the level shifter 214 includes isolation, so that during the standby mode, the mode controller 208 controls the level shifter 214 to perform isolation since VDD2 is turned off while VSS2 remains above VSS3 for source biasing. In this case the level shifter 214 asserts its output to a known logic level compatible with the memory domain 206. In an alternative embodiment, the level shifter 214 does not include isolation and the memory domain 206 incorporates internal isolation so that additional isolation is redundant.

The level shifter 216 performs voltage level shifting of a signal asserted by the memory domain 206 and provided to the core domain 204. Although the level shifter 216 may be configured in substantially the same manner as the level shifter 210, the level shifter 216 may be simplified. In one embodiment, the level shifter 216 performs ground level shifting with bypass. During the full power mode, VDD2 and VDD3 are about the same and VSS2 and VSS3 are about the same, so that ground level shifting capability is bypassed. During the power savings mode, VSS2>VSS3 so that the level shifter 216 performs ground level shifting. Alternatively, the level shifter 216 may be omitted since the signal driven by the memory domain 206 may overdrive the device in the core domain 204 without modifying the logic level. In one embodiment, the level shifter 216 includes isolation, so that during the standby mode, the mode controller 208 controls the level shifter 216 to perform isolation since VDD2 is turned off while VSS2 remains above VSS3 for source biasing. In this case the level shifter 216 asserts its output to a known logic level compatible with the memory domain 206. In an alternative embodiment, the level shifter 216 does not include isolation since the core domain 204 is powered down and spurious signals or unknown signal levels are inconsequential.

The mode controller 208 controls the different modes of the HV, core, and memory domains 202, 204, and 206, and also operates the bypass and isolation enable inputs, if any, of the level shifters 210-216. When the system 200 is operating in the full power mode, the mode controller 208 powers on the core domain 204 without source biasing and sends a ground bypass control signal to level shifters 210, 212, 214, and 216. When the system 200 is operating in source biased low-frequency mode, the mode controller 208 powers the core domain 202 with a source bias of VSS of about 0.4 volts. In this mode, the ground bypass control signal for level shifters 210, 214, and 216 is unasserted. When the system 200 is operating in standby mode, the mode controller 208 powers down the core domain 204 and enables isolation for level shifters 210, 214, and 216.

Figure 3A:
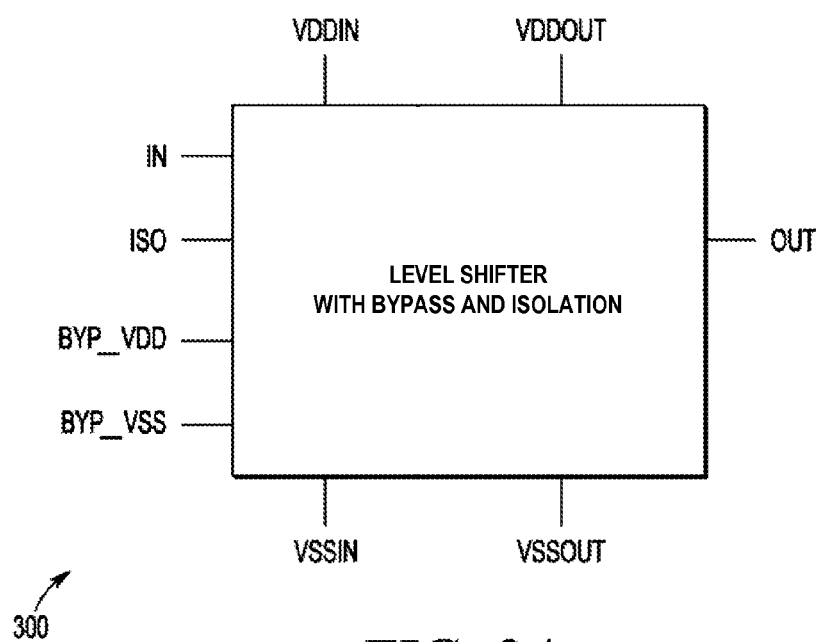
FIGS. 3A, 3B and 3C are a simplified block diagrams of level shifters implemented according to corresponding embodiments, including a super-cell embodiment including power and ground level shifting with power and ground shift bypass and isolation, and simplified embodiments excluding one of isolation and bypass.

FIG. 3A is a simplified block diagram of a level shifter 300 implemented according to one embodiment. The level shifter 300 is configured as a "super-cell" since it includes power and ground level shifting with power and ground shift bypass and further includes isolation. The level shifter 300 may be used as any of the level shifters 210-216 in which one or more of the functions that are not needed are not used. Alternatively, the level shifter 300 may be simplified in which certain portions that perform functions that are not needed are omitted. The level shifter 300 includes source voltage supply nodes VDDIN and VDDOUT and reference voltage nodes VSSIN and VSSOUT. VDDIN and VSSIN are coupled to the VDD and VSS voltage nodes of the power domain providing an input signal IN on a corresponding input node, and VDDOUT and VSSOUT are coupled to the VDD and VSS voltage nodes of the power domain receiving a corresponding output signal OUT on a corresponding output node. The level shifter 300 also includes an isolation enable input node ISO, a power level shift bypass input node BYP_VDD, and a ground level shift bypass input node BYP_VSS.

When ISO, BYP_VDD and BYP_VSS are asserted low to logic 0, then the level shifter 300 performs power and ground level shifting with a delay D1 between the input IN and the output OUT. When BYP_VDD is asserted high to logic 1 and when ISO and BYP_VSS are both asserted to a logic 0, then the level shifter 300 performs ground level shifting between IN and OUT in which power level shifting is bypassed. For ground level shifting with power level shifting bypassed, the delay between IN and OUT is less than D1. When BYP_VSS is asserted to logic 1 and when ISO and BYP_VDD are both asserted to a logic 0, then the level shifter 300 performs power level shifting between IN and OUT in which ground level shifting is bypassed. For power level shifting with ground level shifting bypassed, the delay between IN and OUT is less than D1. When BYP_VDD and BYP_VSS are both asserted to logic 1 and when ISO asserted to a logic 0, then the level shifter 300 bypasses both power and ground level shifting between IN and OUT. When ground and power level shifting are both bypassed, the delay between IN and OUT is less than D1. Furthermore, the delay is minimized between IN and OUT when both power and ground level shifting are both bypassed. When ISO is asserted to a logic 1, then the states of BYP_VDD and BYP_VSS are "don't cares" or irrelevant and the level shifter 300 is placed into an isolation state. In the isolation state, the output OUT is asserted to a known or predetermined logic state at voltage levels compatible with the destination domain. In one embodiment, OUT is asserted to a logic 0 during the isolation state. In another embodiment, OUT is asserted to a logic 1 during the isolation state. In yet another embodiment, OUT is asserted to or otherwise held to the last logic state of OUT when ISO was asserted high and while ISO remains high. For example, if OUT is logic 0 when ISO is pulled to logic 1, then OUT remains at logic 1 while ISO remains asserted to logic 1.

Figure 3B:
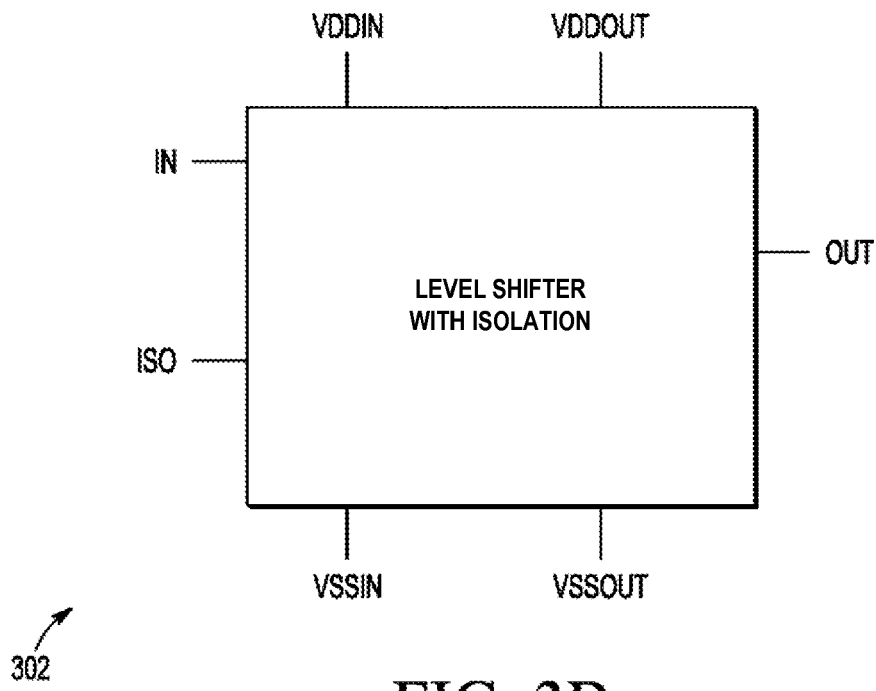

FIG. 3B is a block diagram of a level shifter 302 according to one embodiment that performs power and ground level shifting with isolation but which does not perform power or ground bypass. The level shifter 302 is a simplified version of the level shifter 300 in which the bypass inputs BYP and bypass devices are eliminated as described further herein.

Figure 3C:
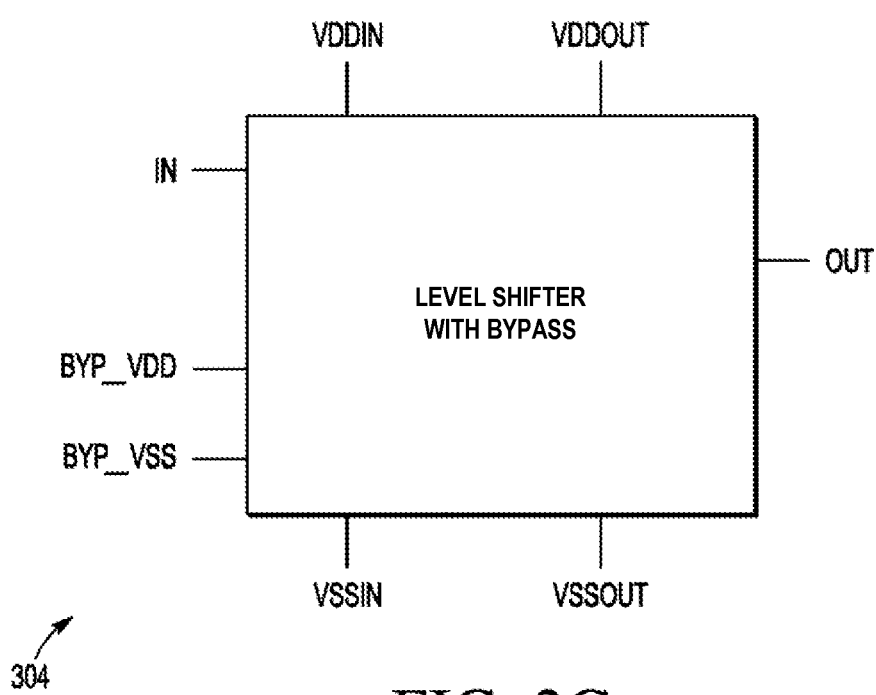

FIG. 3C is a block diagram of a level shifter 304 according to another embodiment that performs power and ground level shifting with power and ground bypass but which does not perform isolation. The level shifter 304 is a simplified version of the level shifter 300 in which the isolation input ISO and the isolation devices are eliminated as described further herein.

Figure 4:
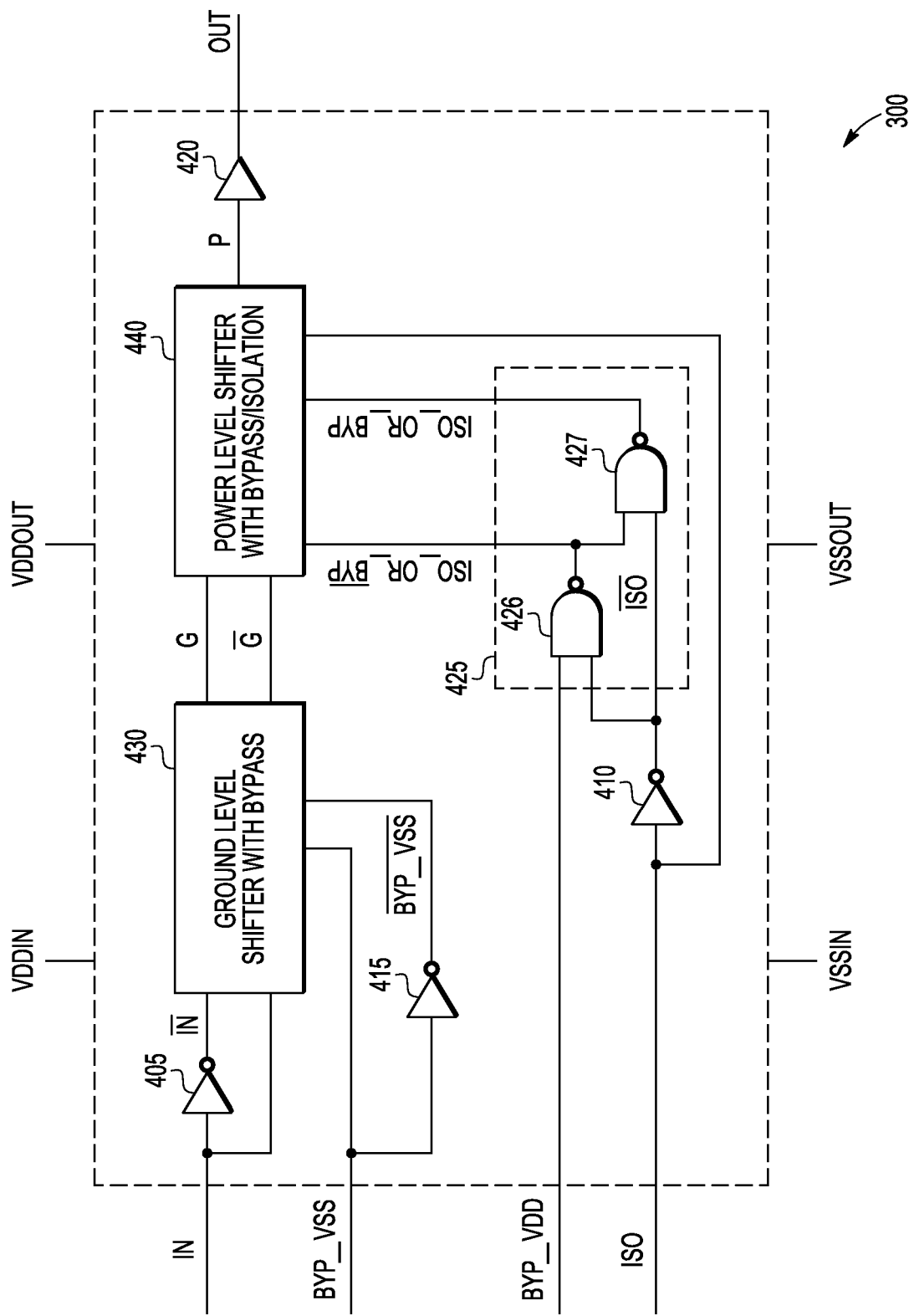
FIG. 4 is a more detailed schematic and block diagram of the level shifter of FIG. 3 according to one embodiment.

FIG. 4 is a more detailed schematic and block diagram of the level shifter 300 according to one embodiment. The level shifter 300 shown in FIG. 4 illustrates ground shifting first followed by power shifting, where it is understood that in an alternative embodiment, power is shifted first followed by ground shifting. In one embodiment, IN is asserted between VDDIN and VSSIN, BYP_VSS is asserted between VDDIN and VSSOUT, and BYP_VDD, ISO, and OUT are asserted between VDDOUT and VSSOUT. External level shift devices (not shown) may be provided, such as within the mode controller 208 or between the mode controller 208 and the level shifters, to facilitate the level shift of the input control signals. The level shifter 300 includes inverters 405, 410, and 415, an output buffer 420, an isolation and bypass control network 425 logically configured as a pair of 2-input NAND gates 426 and 427, a ground level shifter with bypass network 430, and a power level shifter with bypass and isolation network 440. IN is provided to the input of the inverter 405, asserting an inverted input signal $\overline{IN}$ at its output. A signal name with an overstrike denotes logical negation unless otherwise specified. IN and $\overline{IN}$ are provided to respective inputs of the ground level shifter with bypass network 430. BYP_VSS is provided to the input of the inverter 415, asserting an inverted ground bypass signal $\overline{BYP\_VSS}$ at its output. BYP_VSS and $\overline{BYP\_VSS}$ are provided to respective inputs of the ground level shifter with bypass network 430, which asserts intermediate signals G and $\overline{G}$ to respective inputs of the power level shifter with bypass and isolation network 440. ISO is provided to an input of the inverter 410, having an output providing an inverted isolation signal $\overline{ISO}$. BYP_VDD and $\overline{ISO}$ are provided to respective inputs of the NAND gate 426, having its output providing a signal ISO_OR_$\overline{BYP}$ which is provided to one input of the NAND gate 427. The other input of the NAND gate 427 receives $\overline{ISO}$, and the output of the NAND gate 427 asserts a signal ISO_OR_BYP. The ISO, ISO_OR_$\overline{BYP}$ and ISO_OR_BYP signals are provided to respective inputs of the power level shifter with bypass and isolation network 440. The power level shifter with bypass and isolation network 440 has an output providing a preliminary output signal P to an input of the output buffer 420, which has an output coupled to the output node providing the OUT signal.

In one embodiment, the level shifter 300 is configured to facilitate simplified configurations when certain features are not used, such as, for example, for implementing the level shifter 302 or the level shifter 304, among others. For example, when ground-level shifting is not used, an alternative embodiment of the level shifter 300 eliminates the ground level shifter with bypass network 430 and IN and $\overline{IN}$ are provided as the G and $\overline{G}$ inputs to the power level shifter with bypass and isolation network 440. The G and $\overline{G}$ inputs are shifted to the voltage levels of VDDIN and VSSOUT, in which IN is inverted to provide $\overline{G}$ and $\overline{IN}$ is inverted to provide G. It is noted that the inverter 415 or a similar configuration thereof, described below, may be used for this level shifting. When power shifting is not used, the power level shifter with bypass and isolation network 440 is eliminated and modifications are made to the ground level shifter with bypass network 430 to implement isolation. When bypass and isolation capabilities are not used, the BYP_VDD, BYP_VSS, and ISO inputs, the inverters 415 and 410, and the isolation and bypass control network 425 are eliminated. The level shifter 302 represents a configuration with isolation portions included and with power and ground bypass portions removed, and the level shifter 304 represents a configuration with power and ground bypass portions included and with isolation portions removed.

Figure 5A:
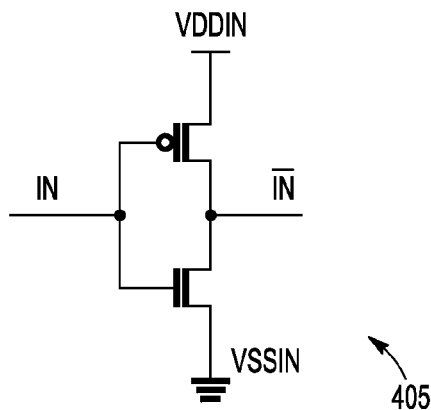
FIGS. 5A, 5B and 5C are schematic diagrams of the inverters of FIG. 4 implemented according to one embodiment.
Figure 5B:
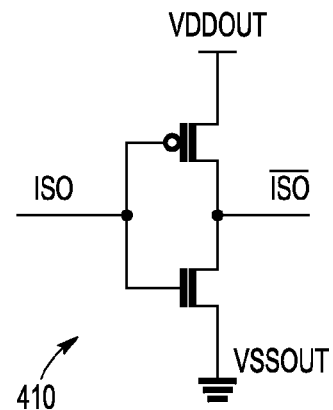
Figure 5C:
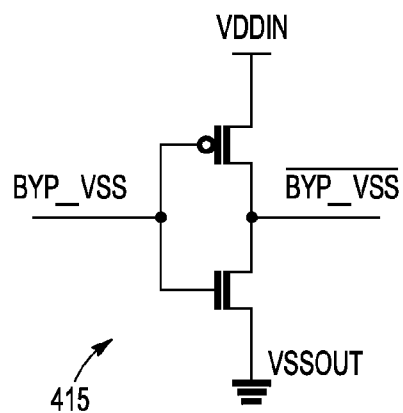

FIGS. 5A, 5B and 5D are schematic diagrams of the inverters 405, 410, and 415, respectively, each implemented according to one embodiment. Each of the inverters 405, 410 and 415 is configured with CMOS devices including an upper PMOS coupled to a lower NMOS between source and reference voltages. As shown in FIG. 5A, inverter 405 receives IN and outputs $\overline{IN}$ and is referenced between VDDIN and VSSIN. As shown in FIG. 5B, inverter 410 receives ISO and outputs $\overline{ISO}$ and is referenced between VDDOUT and VSSOUT. As shown in FIG. 5C, inverter 415 receives BYP_VSS and outputs $\overline{BYP\_VSS}$ and is referenced between VDDIN and VSSOUT.

Figure 6:
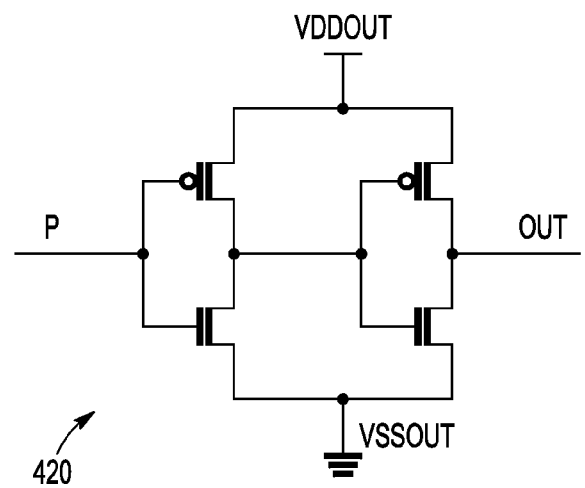
FIG. 6 is a schematic diagram of the output buffer of FIG. 4 according to one embodiment.

FIG. 6 is a schematic diagram of the output buffer 420 according to one embodiment. The output buffer 420 is implemented as back to back CMOS inverters each implemented in a similar manner as the inverter 410 referenced between VDDOUT and VSSOUT. The output buffer 420 receives P and outputs OUT.

Figure 7:
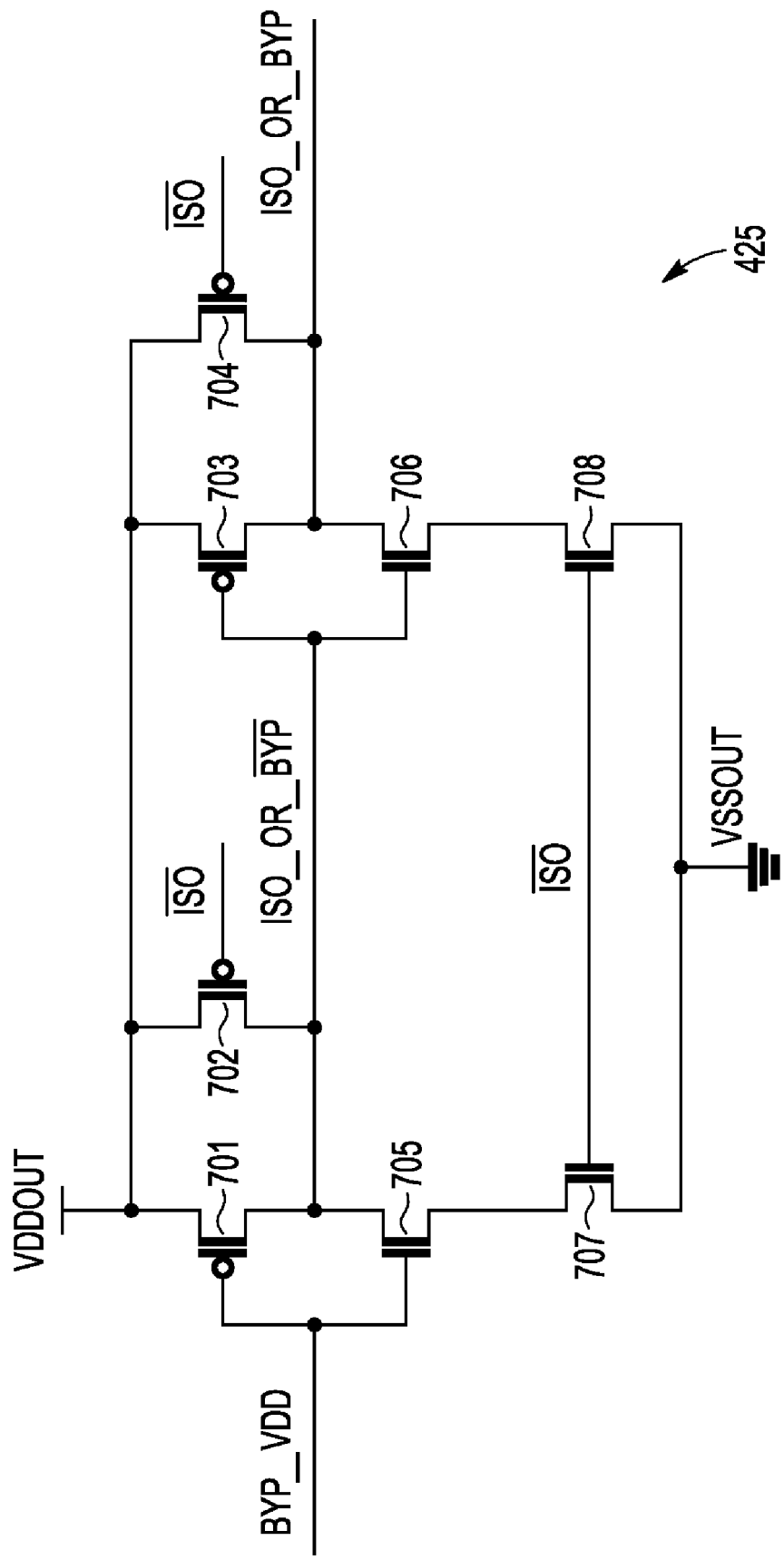
FIG. 7 is a schematic diagram of the isolation control network of FIG. 4 according to one embodiment.

FIG. 7 is a schematic diagram of the isolation and bypass control network 425 according to one embodiment. The isolation and bypass control network 425 includes PMOS devices 701-704 and NMOS devices 705-708. PMOS devices 701 and 702 have their current terminals (source and drain) coupled between VDDOUT and ISO_OR_$\overline{BYP}$ and PMOS devices 703 and 704 have their current terminals coupled between VDDOUT and ISO_OR_BYP. BYP_VDD is provided to the gates of PMOS device 701 and NMOS device 705. ISO_OR_$\overline{BYP}$ is provided to the gates of PMOS device 703 and NMOS device 706. $\overline{ISO}$ is provided to the gates of PMOS devices 702 and 704 and NMOS devices 707 and 708. NMOS device 705 has its drain coupled to ISO_OR_$\overline{BYP}$ and NMOS device 706 has its drain coupled to ISO_OR_BYP. NMOS device 707 has its drain coupled to the source of NMOS device 705 and NMOS device 708 has its drain coupled to the source of NMOS device 706. The sources of NMOS devices 707 and 708 are coupled to VSSOUT. In the illustrated embodiment, input signals BYP_VDD and $\overline{ISO}$ are asserted at voltage levels of the output domain (VDDOUT and VSSOUT) so that the output signals ISO_OR_$\overline{BYP}$ and ISO_OR_BYP are also asserted at the voltage levels of the output domain. The isolation and bypass control network 425 is logically configured as back to back NAND gates 426 and 427 as previously described.

Figure 8:
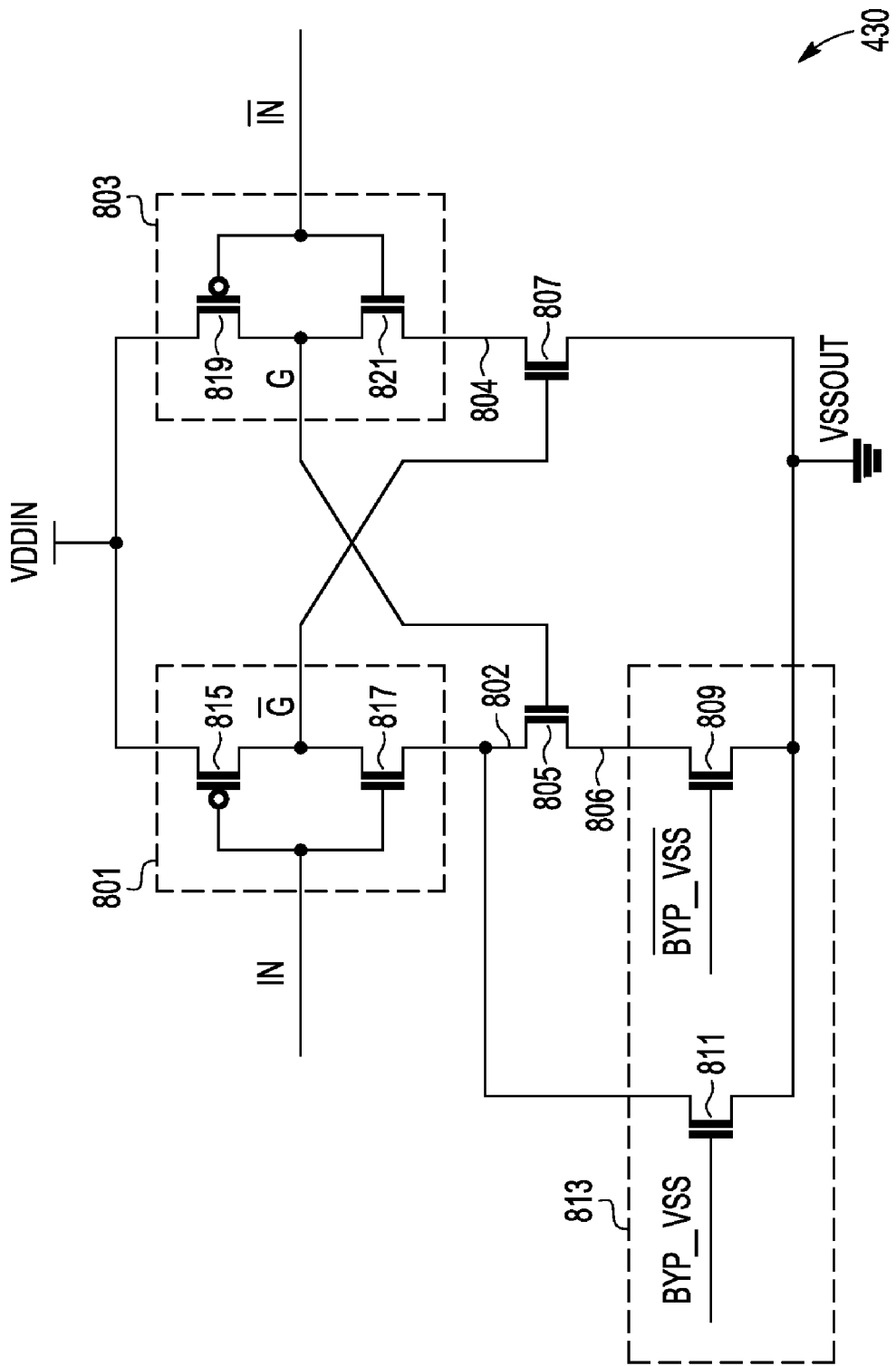
FIG. 8 is a schematic diagram of the ground level shifter with bypass network of FIG. 4 according to one embodiment.

FIG. 8 is a schematic diagram of the ground level shifter with bypass network 430 according to one embodiment. In the illustrated embodiment, the ground level shifter with bypass network 430 includes a pair of CMOS inverters 801 and 803 and NMOS devices 805, 807, 809 and 811. The NMOS devices 809 and 811 form a bypass circuit 813. The CMOS inverter 801 includes an upper PMOS device 815 and a lower NMOS device 817, and the CMOS inverter 803 includes an upper PMOS device 819 and a lower NMOS device 821. CMOS inverter 801 is coupled between VDDIN and a node 802 and CMOS inverter 803 is coupled between VDDIN and a node 804. NMOS device 805 has its drain coupled to node 802 and its source coupled to node 806. NMOS device 807 has its drain coupled to node 804 and its source coupled to VSSOUT. NMOS device 809 has its drain coupled to node 806 and its source coupled to VSSOUT. NMOS device 811 has its drain coupled to node 802 and its source coupled to VSSOUT. IN is provided to the input of the CMOS inverter 801 having its output providing the $\overline{G}$ signal to the gate of NMOS device 807. $\overline{IN}$ is provided to the input of the CMOS inverter 803 having its output providing the G signal to the gate of NMOS device 805. BYP_VSS is provided to the gate of NMOS device 811 and $\overline{BYP\_VSS}$ is provided to the gate of NMOS device 809. The NMOS devices 805 and 807 operate as voltage level shifting devices.

Operation of the illustrated ground level shifter with bypass network 430 is as follows. Assume an initial condition in which IN is high at VDDIN, $\overline{IN}$ is low at VSSIN, and BYP_VSS is low at VSSOUT. In this case, assume also that VSSIN is at a higher voltage level than VSSOUT. $\overline{BYP\_VSS}$ is pulled high to VDDIN by inverter 415. Since BYP_VSS is low and $\overline{BYP\_VSS}$ is high, NMOS device 811 is turned off and NMOS device 809 is turned on pulling node 806 to VSSOUT. In the initial steady state, even though $\overline{IN}$ is pulled low only to VSSIN rather than all the way to VSSOUT, G is high at VDDIN so that NMOS device 805 is turned fully on, and $\overline{G}$ is low at VSSOUT turning NMOS device 807 fully off. IN is then pulled low to VSSIN. Since IN is pulled low only to VSSIN rather than all the way to VSSOUT, the PMOS device 815 begins to turn on and the NMOS device 817 begins to turn off. $\overline{G}$, though slightly delayed, begins to go high to begin turning on NMOS device 807. Meanwhile, $\overline{IN}$ is pulled high to VDDIN by the inverter 405, turning off the PMOS device 819 and turning on the NMOS device 821. G is eventually pulled low via devices 821 and 807 turning off the NMOS device 805, so that $\overline{G}$ is pulled high to VDDIN via device 815 turning the NMOS device 807 fully on. When IN is next pulled high and $\overline{IN}$ is pulled low, operation is substantially similar yet in the opposite direction. A delay is incurred since VSSIN is higher than VSSOUT, and the level shift NMOS devices 805 and 807 ensure switching of the G and $\overline{G}$ signals between VDDIN and VSSOUT.

When BYP_VSS is pulled high indicating that VSSIN is about the same as VSSOUT, the NMOS device 809 is turned off de-coupling the NMOS device 805 from VSSOUT. Also, the NMOS device 811 is turned on thus coupling node 802 to VSSOUT so that the CMOS inverter 801 is referenced between VDDIN and VSSOUT. Also, IN and $\overline{IN}$ switch between VDDIN and VSSOUT since VSSIN is about the same as VSSOUT. Operation is similar except that the delay is significantly reduced. When IN goes low, the CMOS inverter 801 is turned fully on and $\overline{G}$ is pulled high turning NMOS device 807 on more quickly, so that the CMOS inverter 803 is referenced between VDDIN and VSSOUT. When $\overline{IN}$ goes high, G is pulled low more quickly.

The bypass function may be removed simply by eliminating the bypass circuit 813 and coupling the source of the NMOS device 805 to VSSOUT.

Figure 9A:
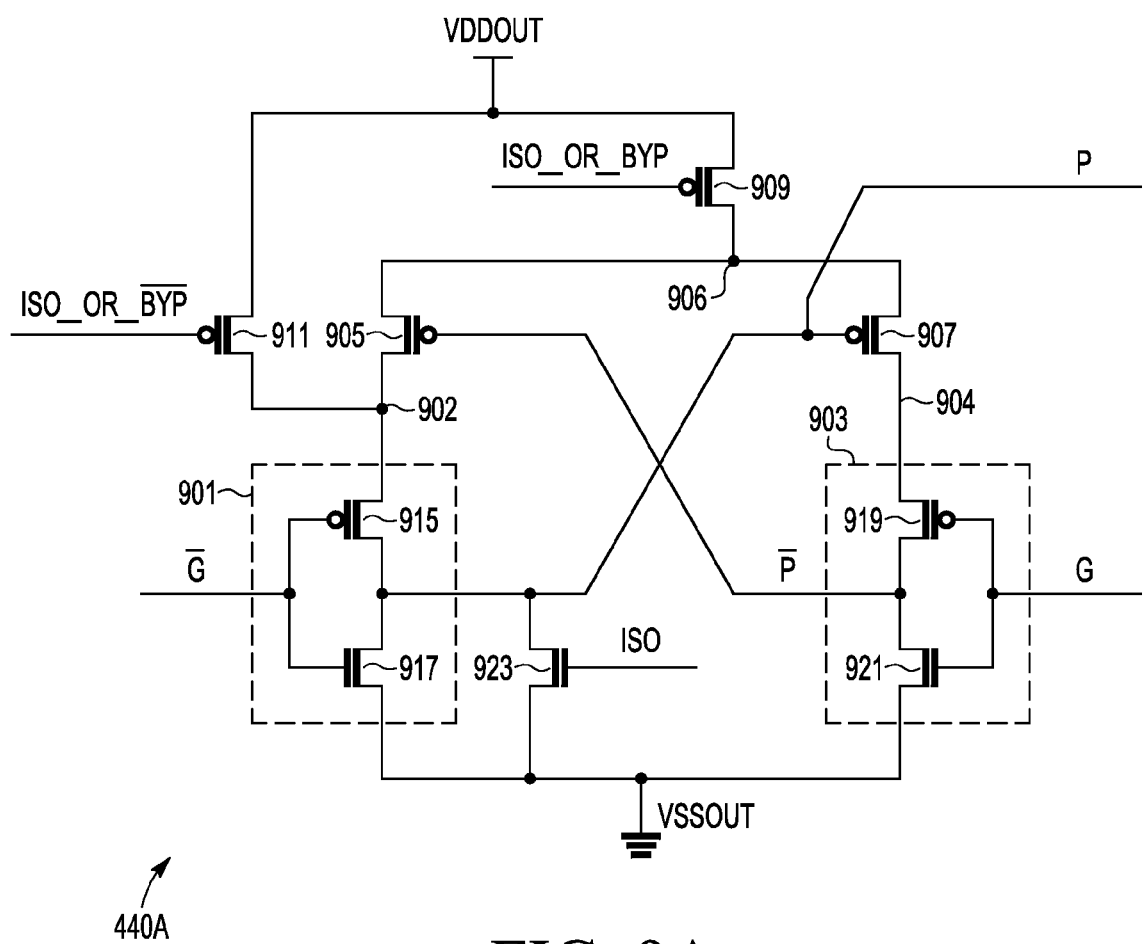
FIGS. 9A, 9B and 9C are schematic diagrams of three different embodiments of the power level shifter with bypass and isolation network of FIG. 4 for asserting the output at logic low, logic high, and a held logic level, respectively.
Figure 9B:
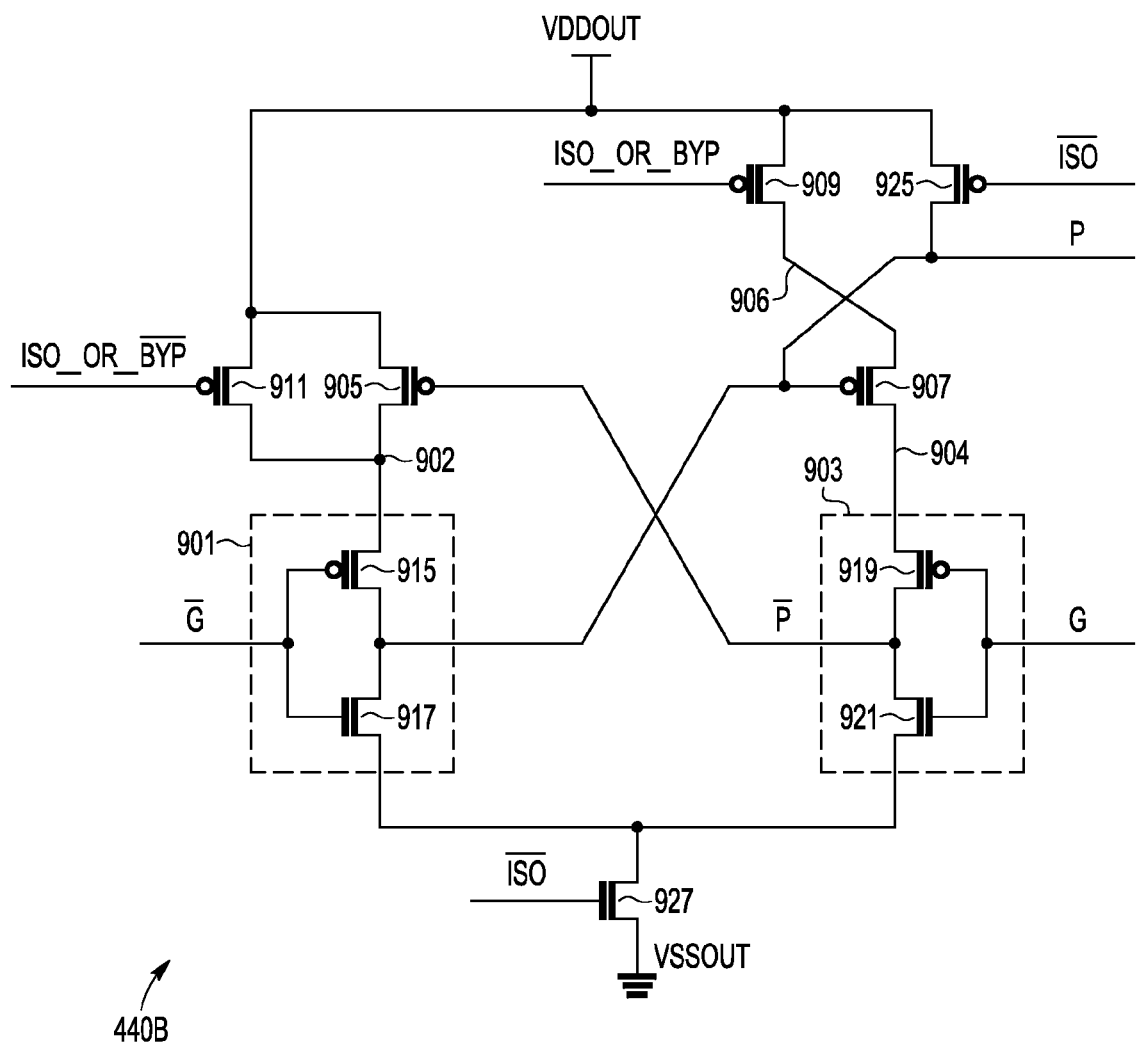
Figure 9C:
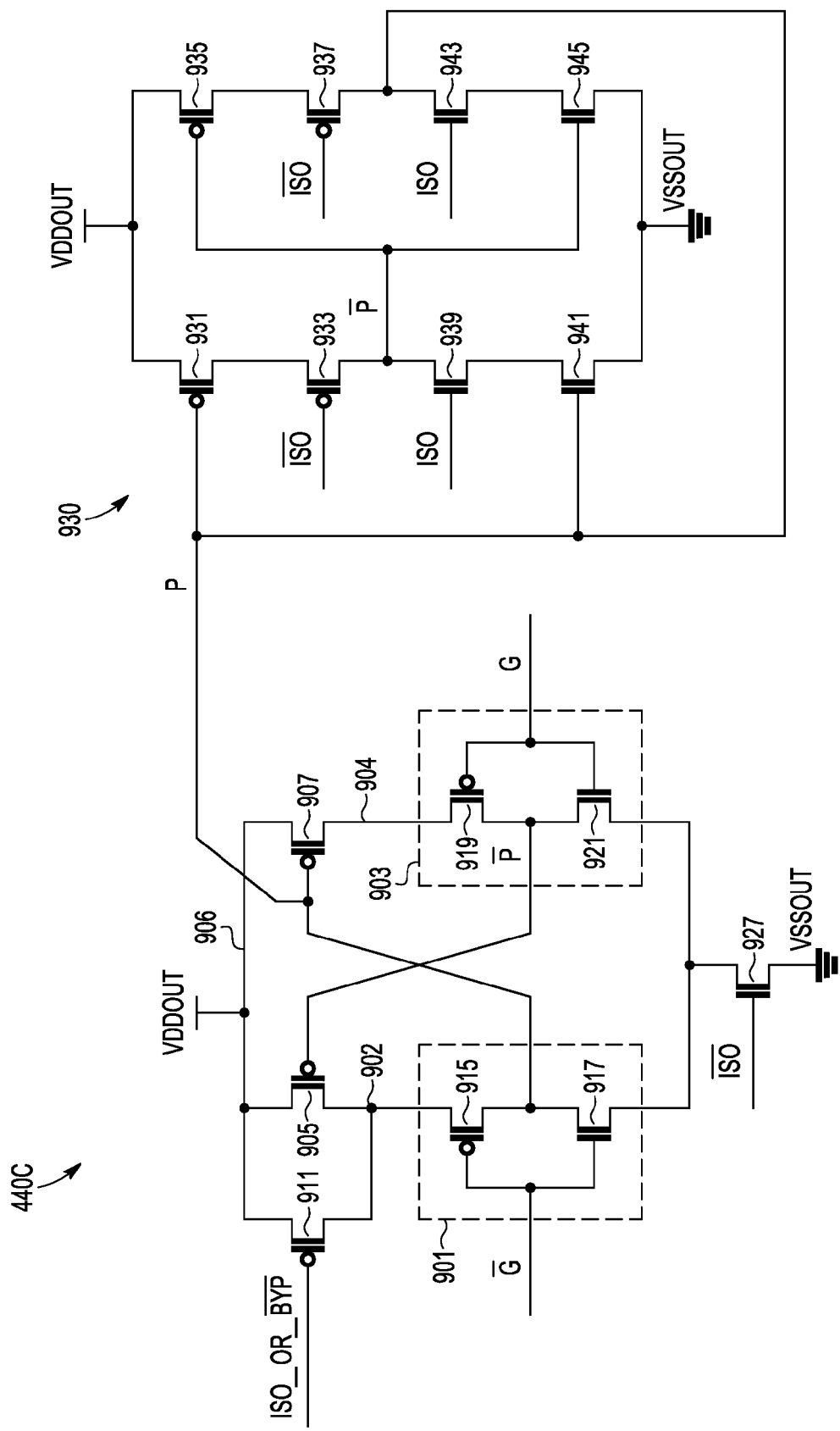

FIGS. 9A, 9B and 9C are schematic diagrams of three different embodiments of the power level shifter with bypass and isolation network 440, shown as power level shifter with bypass and isolation network 440A, 440B, and 440C, respectively. Each embodiment receives the intermediate signals G and $\overline{G}$ which switch between voltage levels VDDIN and VSSOUT and provides the P signal which switches between VDDOUT and VSSOUT. The three networks 440A-440C differ in the state of the P signal when the isolation enable signal ISO is asserted high to logic 1.

FIG. 9A is a schematic diagram of the power level shifter with bypass and isolation network 440A according to one embodiment of the power level shifter with bypass and isolation network 440 in which the P signal is pulled low when ISO is asserted high for isolation. The power level shifter with bypass and isolation network 440A includes a pair of CMOS inverters 901 and 903, PMOS devices 905, 907, 909 and 911 and an NMOS device 923. The CMOS inverter 901 includes an upper PMOS device 915 and a lower NMOS device 917, and the CMOS inverter 903 includes an upper PMOS device 919 and a lower NMOS device 921. CMOS inverter 901 is coupled between VDDOUT and a node 902 and CMOS inverter 903 is coupled between VDDOUT and a node 904. PMOS device 905 has its drain coupled to node 902 and its source coupled to node 906. PMOS device 907 has its drain coupled to node 904 and its source coupled to node 906. PMOS device 909 has its drain coupled to node 906 and its source coupled to VDDOUT. PMOS device 911 has its drain coupled to node 902 and its source coupled to VDDOUT. $\overline{G}$ is provided to the input of the CMOS inverter 901 having its output providing the P signal which is further provided to the gate of PMOS device 907. G is provided to the input of the CMOS inverter 903 having its output providing a signal $\overline{P}$ (inverted version of P) to the gate of PMOS device 905. ISO_OR_$\overline{BYP}$ is provided to the gate of PMOS device 911 and ISO_OR_BYP is provided to the gate of PMOS device 909. The PMOS devices 905 and 907 operate as voltage level shifting devices. NMOS device 923 has its drain coupled to P, its source coupled to VSSOUT, and its gate receiving ISO.

Operation of the illustrated power level shifter with bypass and isolation network 440A is as follows. Assume an initial condition in which $\overline{G}$ is low at VSSOUT, G is high at VDDIN, and BYP_VDD and ISO are both low at VSSOUT. In this case, assume also that VDDOUT is at a higher voltage level than VDDIN. Since BYP_VSS and ISO are both low, PMOS device 911 is turned off, NMOS device 923 is turned off, and PMOS device 909 is turned on pulling node 906 to VDDOUT. In the initial steady state, even though G is pulled high only to VDDIN rather than all the way to VDDOUT, $\overline{P}$ is low at VSSOUT so that PMOS device 905 is turned fully on, and P is high at VDDOUT turning PMOS device 907 fully off. $\overline{G}$ is then pulled high to VDDIN. Since $\overline{G}$ is pulled high only to VDDIN rather than all the way to VDDOUT, the PMOS device 915 begins to turn off and the NMOS device 917 begins to turn on. P, though slightly delayed, begins to go low to begin turning on PMOS device 907. G is pulled low to VSSOUT, turning on the PMOS device 919 and turning off the NMOS device 921. $\overline{P}$ is eventually pulled high via devices 907 and 919 turning off the PMOS device 905, so that P is pulled low via device 917 to VSSOUT turning the PMOS device 907 fully on. When $\overline{G}$ is next pulled low and G is pulled high, operation is substantially similar yet in the opposite direction. A delay is incurred since VDDIN is lower than VDDOUT, and the level shift PMOS devices 905 and 907 ensure switching of the P and $\overline{P}$ signals between VDDOUT and VSSOUT.

When BYP_VDD is pulled high indicating that VDDIN is about the same as VDDOUT, ISO_OR_BYP goes high turning off the PMOS device 909 de-coupling the PMOS devices 905 and 907 from VDDOUT. Also, ISO_OR_$\overline{BYP}$ is pulled low turning on the PMOS device 911 thus coupling node 902 to VDDOUT so that the CMOS inverter 901 is referenced between VDDOUT and VSSOUT. Also, G and $\overline{G}$ switch between VDDOUT and VSSOUT. Operation is similar except that the delay is significantly reduced. Since the CMOS inverter 901 is referenced between VDDOUT and VSSOUT and $\overline{G}$ also switches between VDDOUT and VSSOUT, the CMOS inverter 901 provides the only delay between $\overline{G}$ and P regardless of operation of the remaining portions of the circuit. It is further noted that if BYP_VSS and BYP_VDD are both asserted high to logic 1 thus bypassing both power and ground level shifting, then the CMOS inverters 801 and 901 are the only delay between IN and P further reducing delay.

When ISO is pulled high for isolation, the NMOS device 923 is turned on pulling P to VSSOUT regardless of operation of the remaining portions of the circuit.

The bypass function may be removed simply by eliminating the PMOS devices 909 and 911 and coupling node 906 directly to VDDOUT. The isolation function may be removed simply by eliminating the NMOS device 923.

FIG. 9B is a schematic diagram of the power level shifter with bypass and isolation network 440B according to another embodiment of the power level shifter with bypass and isolation network 440 in which the P signal is pulled high when ISO is asserted high for isolation. The power level shifter with bypass and isolation network 440B is substantially similar to the power level shifter with bypass and isolation network 440A in which similar components assume identical reference numbers. For the power level shifter with bypass and isolation network 440B, the source of PMOS device 905 is coupled to VDDOUT rather than node 906, isolation NMOS device 923 is replaced by isolation PMOS device 925 and isolation NMOS device 927, and the sources of NMOS devices 917 and 921 are de-coupled from VSSOUT and instead coupled to the drain of NMOS device 927, which has its source coupled to VSSOUT and its gate receiving $\overline{ISO}$. The source of PMOS device 925 is coupled to VDDOUT, its drain is coupled to P, and its gate receives $\overline{ISO}$. Level shift and power bypass operation of the power level shifter with bypass and isolation network 440B is substantially similar to that of the power level shifter with bypass and isolation network 440A. When ISO is low, $\overline{ISO}$ is high turning on NMOS device 927 to couple the CMOS inverters 901 and 903 to VSSOUT in similar manner. Furthermore, PMOS device 925 is turned off. When ISO is asserted high, $\overline{ISO}$ is low so that the PMOS device 925 is turned on and the NMOS device 927 is turned off. The NMOS device 927 decouples the circuit from VSSOUT during isolation and the PMOS device 925 pulls P directly to VDDOUT regardless of operation of the remaining portion of the circuit.

The bypass function may be removed simply by eliminating the PMOS devices 909 and 911 and coupling node 906 directly to VDDOUT. The isolation function may be removed simply by eliminating the isolation devices 925 and 927 and coupling the CMOS inverters 901 and 903 to VSSOUT.

FIG. 9C is a schematic diagram of the power level shifter with bypass and isolation network 440C according to another embodiment of the power level shifter with bypass and isolation network 440 in which the P signal is held to its last logic level during isolation. The power level shifter with bypass and isolation network 440C is substantially similar to the power level shifter with bypass and isolation network 440B in which similar components assume identical reference numbers. The PMOS devices 909 and 925 are eliminated and node 906 is coupled directly to VDDOUT. Level shift and power bypass operation of the power level shifter with bypass and isolation network 440B is substantially similar to that of the power level shifter with bypass and isolation network 440A.

The power level shifter with bypass and isolation network 440C further includes a keeper network 930 which keeps the logic level of P at the last state when ISO is asserted high. The keeper network 930 includes PMOS devices 931, 933, 935 and 937 and NMOS devices 939, 941, 943 and 945. The PMOS devices 931 and 933 have their current terminals coupled in series between VDDOUT and $\overline{P}$, the PMOS devices 935 and 937 have their current terminals coupled in series between VDDOUT and P, the NMOS devices 939 and 941 have their current terminals coupled in series between $\overline{P}$ and VSSOUT, and the NMOS devices 943 and 945 have their current terminals coupled in series between P and VSSOUT. P is further provided to the gates of devices 931 and 941, $\overline{P}$ is further provided to the gates of devices 935 and 945, $\overline{ISO}$ is provided to the gates of devices 933 and 937, and ISO is provided to the gates of devices 939 and 943.

In operation of the keeper network 930 and the NMOS device 927, when ISO is asserted low turning off isolation, $\overline{ISO}$ is asserted high turning on device 927 referencing the level shift portion to VSSOUT for normal level shift operation as previously described. Further, when ISO is low, the inner devices 933, 937, 939 and 943 are turned off effectively turning off the keeper network 930. When ISO is asserted high, device 927 is turned on de-coupling the level shift portion from VSSOUT. If P is high and $\overline{P}$ is low when ISO is asserted high, then devices 941 and 935 are also turned on reinforcing the states of P and $\overline{P}$. In particular, devices 939 and 941 are turned on to keep $\overline{P}$ low and devices 935 and 937 are turned on to keep P high. If instead P is low and $\overline{P}$ is high when ISO is asserted high, then devices 931 and 945 are turned on reinforcing the states of P and $\overline{P}$. In particular, devices 931 and 933 are turned on to keep $\overline{P}$ high and devices 943 and 945 are turned on to keep P low.

A level shifter according to one embodiment includes input and output power nodes, input and output reference nodes, input and output signal nodes, and a lever shifter network. The input power and input reference nodes operate within a first power domain and the output power and output reference nodes operate within a second power domain. The input signal node receives an input signal operable within the first power domain. The level shifter network is configured to receive the input signal, to perform voltage shifting between the input power node and the output power node and between the input reference node and the output reference node, and to provide an output signal via the output signal node, where the output signal is indicative of the input signal and operates within the second power domain.

The level shifter may include power and/or ground bypass such that either one or both of power and ground voltage shifting may be bypassed for faster switching. The level shifter may include an isolation input so that the output is asserted to a voltage level of the output power node or the output reference node.

An integrated circuit according to one embodiment includes first and second circuits and a voltage level shifter. The first circuit operates within a first voltage domain between a first reference voltage and a first source voltage. The second circuit operates within a second voltage domain between a second reference voltage which is different from the first reference voltage and a second source voltage which is different from the first source voltage. The voltage level shifter is coupled to receive an input signal from the first circuit, is configured to perform voltage shifting between the first reference voltage and the second reference voltage and between the first source voltage and the second source voltage, and is configured to provide an output signal to the second circuit. The output signal is indicative of the input signal and is operable within the second voltage domain.

The integrated circuit may include a mode controller which adjusts at least one of the first and second reference voltages so that the first and second reference voltages are at the same voltage level, and which asserts a bypass signal to the voltage level shifter to bypass voltage shifting between the first reference voltage and the second reference voltage. Alternatively, or in addition, the mode controller adjusts at least one of the first and second source voltages so that the first and second source voltages are at the same voltage level. Thus, the mode controller asserts a bypass signal to the voltage level shifter to bypass voltage shifting between the first source voltage and the second source voltage. In addition, the mode controller may place the first circuit into a low power mode, in which it may assert an isolation signal to the voltage level shifter to drive the output signal to one of the second reference voltage and the second source voltage.

A method of voltage level shifting a binary signal between independent power domains for both power and reference voltage levels according to one embodiment includes receiving an input binary signal operative within a first power domain, in which the input binary signal switches between a first reference voltage and a first source voltage, and level shifting the input binary signal to an output binary signal operative within a second power domain, where the output binary signal switches between a second reference voltage and a second source voltage, and where the second reference voltage is different from the first reference voltage and the second source voltage is different from the first source voltage. The level shifting may include level shifting the first reference voltage of the binary signal to the second reference voltage and providing an intermediate binary signal which switches between the second reference voltage and the first source voltage, and level shifting the first source voltage of the intermediate signal to the second source voltage and providing an output binary signal which switches between the second reference voltage and the second source voltage of a second voltage domain. The method may include bypassing the level shifting between the first and second reference voltages when the first and second reference voltages are at a common voltage level. The method may include bypassing the level shifting between the first and second source voltages when the first and second source voltages are at a common voltage level. The method may include asserting the output binary signal to one of the second reference voltage and the second source voltage during the low power state.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present invention without departing from the spirit and scope of the invention as defined by the appended claims.

The invention claimed is:

1. A level shifter, comprising:
an input voltage supply node and an input reference node operative within a first power domain;
an output voltage supply node and an output reference node operative within a second power domain;
an input signal node for receiving an input signal operable within said first power domain;
an output signal node;
a level shifter network which is configured to receive said input signal at said input signal node, to perform voltage shifting between said input voltage supply node and said output voltage supply node and between said input reference node and said output reference node, and to provide an output signal via said output signal node, wherein said output signal represents said input signal and is operable within said second power domain; and
wherein said level shifter circuit further comprises a ground bypass input for receiving a ground bypass signal, and wherein said level shifter circuit bypasses at least a portion of said level shifter circuit performing voltage shifting between said input reference node and said output reference node when said ground bypass signal indicates ground bypass.

2. The level shifter of claim 1, wherein said level shifter network further comprises a voltage supply bypass input configured to receive a voltage supply bypass signal, and wherein said level shifter network bypasses at least a portion of the level network performing voltage shifting between said input voltage supply node and said output voltage supply node when said voltage supply bypass signal indicates voltage supply bypass.

3. The level shifter of claim 1, wherein said level shifter network further comprises an isolation input configured to receive an isolation signal, and wherein said level shifter network drives said output node to one of said output voltage supply node and said output reference node when said isolation signal indicates isolation.

4. The level shifter of claim 1, wherein said level shifter network comprises:
a reference level shifter which receives said input signal and which provides a corresponding intermediate signal operable between said input voltage supply node and said output reference node; and
a power level shifter which receives said intermediate signal and which provides said output signal operable between said output voltage supply node and said output reference node.

5. The level shifter of claim 4, wherein said reference level shifter comprises:
a first inverter coupled between said input voltage supply node and said input reference node having an input receiving said input signal and an output providing an inverted input signal operative within said first power domain;
a second inverter coupled between said input voltage supply node and a first node, said second inverter having an input receiving said input signal and an output coupled to a first intermediate node;
a third inverter coupled between said input voltage supply node and a second node, said third inverter having an input receiving said inverted input signal and an output coupled to a second intermediate node;
a first level shift device having a current path coupled between said first node and said output reference node and having a control input coupled to said second intermediate node; and
a second level shift device having a current path coupled between said second node and said output reference node and having a control input coupled to said first intermediate node.

6. The level shifter of claim 5, wherein said first, second and third inverters each comprise complementary metal-oxide semiconductor inverters and wherein said first and second level shift devices each comprise an N-channel metal-oxide semiconductor device.

7. The level shifter of claim 5, further comprising a bypass circuit which, when asserted for ground voltage shifting bypass, couples said first node to said output reference node and decouples said first level shift device from said output reference node.

8. The level shifter of claim 4, wherein said reference level shifter provides said intermediate signal and an inverted intermediate signal, and wherein said power level shifter comprises:
a first inverter coupled between said output reference node and a first node, said first inverter having an input receiving said inverted intermediate signal and an output coupled to an intermediate output node;
a second inverter coupled between said output reference node and a second node, said second inverter having an input receiving said intermediate signal and an output coupled to a third node;
a first level shift device having a current path coupled between said first node and said output voltage supply node and having a control input coupled to said third node;
a second level shift device having a current path coupled between said second node and said output voltage supply node and having a control input coupled to said intermediate output node; and
a buffer having an input coupled to said intermediate output node and an output coupled to said output signal node providing said output signal.

9. The level shifter of claim 8, wherein said first and second inverters each comprise complementary metal-oxide semiconductor inverters and wherein said first and second level shift devices each comprise a P-channel metal-oxide semiconductor device.

10. The level shifter of claim 8, further comprising a bypass circuit which, when asserted for power shifting bypass, couples said first node to said output voltage supply node.

11. The level shifter of claim 8, further comprising an isolation circuit which, when asserted for isolation, drives said intermediate output node to one of said output voltage supply node and said output reference node.

12. A method of voltage level shifting a binary signal between independent voltage domains, comprising:
   receiving an input binary signal operative within a first power domain, wherein the input binary signal switches between a first reference voltage and a first source voltage;
   level shifting the input binary signal to an output binary signal operative within a second power domain, wherein the output binary signal switches between a second reference voltage and a second source voltage, and wherein the second reference voltage is different from the first reference voltage and the second source voltage is different from the first source voltage;
   receiving a reference bypass signal indicating that the first and second reference voltages are at a common voltage level; and
   bypassing said level shifting between the first and second reference voltages when the bypass signal indicates that the first and second reference voltages are at a common voltage level.

13. The method of claim 12, wherein said level shifting comprises:
   level shifting the first reference voltage of the input binary signal to the second reference voltage and providing an intermediate binary signal which switches between the second reference voltage and the first source voltage; and
   level shifting the first source voltage of the intermediate signal to the second source voltage and providing the output binary signal which switches between the second reference voltage and the second source voltage of the second power domain.

14. The method of claim 12, further comprising:
   receiving a voltage supply bypass signal indicatin that the first and second source voltages are at a common voltage level; and
   bypassing said level shifting between the first and second source voltages when the voltage supply bypass signal indicates that the first and second source voltages are at a common voltage level.

15. The method of claim 12, further comprising:
   receiving an isolation signal indicating a lower power state; and
   asserting the output binary signal to one of the second reference voltage and the second source voltage during the low power state.

16. A level shifter, comprising:
   an input voltage supply node and an input reference node operative within a first power domain;
   an output voltage supply node and an output reference node operative within a second power domain;
   an input signal node for receiving an input signal operable within said first power domain;
   an output signal node;
   a level shifter circuit which is configured to receive said input signal at said input signal node, to perform voltage shifting between said input voltage supply node and said output voltage supply node and between said input reference node and said output reference node, and to provide an output signal via said output signal node, wherein said output signal represents said input signal and is operable within said second power domain; and
   wherein said level shifter circuit further comprises a voltage supply bypass input for receiving a voltage supply bypass signal, and wherein said level shifter circuit bypasses at least a portion of said level shifter circuit performing voltage shifting between said input voltage supply node and said output voltage supply node when said voltage supply bypass signal indicates voltage supply bypass.

17. The level shifter of claim 16, wherein said level shifter circuit further comprises an isolation input configured to receive an isolation signal, and wherein said level shifter circuit drives said output node to one of said output voltage supply node and said output reference node when said isolation signal indicates isolation.

18. A method of voltage level shifting a binary signal between independent voltage domains, comprising:
   receiving an input binary signal operative within a first power domain, wherein the input binary signal switches between a first reference voltage and a first source voltage;
   level shifting the input binary signal to an output binary signal operative within a second power domain, wherein the output binary signal switches between a second reference voltage and a second source voltage, and wherein the second reference voltage is different from the first reference voltage and the second source voltage is different from the first source voltage;
   receiving a source bypass signal indicating that the first and second source voltages are at a common voltage level; and
   bypassing said level shifting between the first and second source voltages when the bypass signal indicates that the first and second source voltages are at a common voltage level.

19. The method of claim 18, further comprising:
   receiving an isolation signal indicating a lower power state; and
   asserting the output binary signal to one of the second reference voltage and the second source voltage during the low power state.

* * * * *